US012683129B2

(12) United States Patent
Jo et al.

(10) Patent No.: US 12,683,129 B2
(45) Date of Patent: *Jul. 14, 2026

(54) BATCH TYPE SUBSTRATE PROCESSING APPARATUS

(71) Applicant: EUGENE TECHNOLOGY CO., LTD., Yongin-Si (KR)

(72) Inventors: Jeong Hee Jo, Yongin-Si (KR); Chang Dol Kim, Yongin-Si (KR)

(73) Assignee: EUGENE TECHNOLOGY CO., LTD. (KR)

( * ) Notice: Subject to any disclaimer, the term of this patent is extended or adjusted under 35 U.S.C. 154(b) by 546 days.

This patent is subject to a terminal disclaimer.

(21) Appl. No.: 17/507,776

(22) Filed: Oct. 21, 2021

(65) Prior Publication Data

US 2022/0130647 A1 Apr. 28, 2022

(30) Foreign Application Priority Data

Oct. 26, 2020 (KR) ........................ 10-2020-0139301

(51) Int. Cl.
*H01J 37/32* (2006.01)
*C23C 16/503* (2006.01)
(52) U.S. Cl.
CPC ...... *H01J 37/32577* (2013.01); *C23C 16/503* (2013.01); *H01J 37/32091* (2013.01); *H01J 37/3244* (2013.01); *H01J 2237/201* (2013.01)
(58) Field of Classification Search
CPC ........... H01J 37/32577; H01J 37/32091; H01J 37/3244; H01J 2237/201; H01J 37/32568;

H01J 37/32779; H01J 37/32458; H01J 37/32532; H01J 37/32816; H01J 37/321; H01J 15/00; H01J 37/32082;
(Continued)

(56) References Cited

U.S. PATENT DOCUMENTS 4,786,352 A * 11/1988 Benzing .............. C23C 16/4405
134/1
5,383,984 A * 1/1995 Shimada ........... H01L 21/67109
156/345.43
(Continued)

FOREIGN PATENT DOCUMENTS

CN 109037095 A 12/2018
JP 2012114340 A 6/2012
(Continued)

*Primary Examiner* — Rudy Zervigon
(74) *Attorney, Agent, or Firm* — Renaissance IP Law Group LLP

(57) ABSTRACT

Provided is a batch type substrate processing apparatus that supplies a process gas decomposed in a discharge space, which is distinguished from a processing space, into the processing space. The batch type substrate processing apparatus includes a reaction tube configured to provide a processing space, a plasma forming part having a discharge space, which is distinguished from the processing space by a partition wall and generating plasma in the discharge space by a plurality of electrodes extending along a longitudinal direction of the reaction tube. The plurality of electrodes includes a plurality of power supply electrodes spaced apart from each other and a plurality of ground electrodes provided between the plurality of power supply electrodes.

11 Claims, 6 Drawing Sheets

(58) Field of Classification Search
CPC .......... H01J 37/32623; H01J 37/32009; C23C
16/503; C23C 16/4401; C23C 16/452;
C23C 16/505; C23C 16/45578; C23C
16/4583; C23C 16/507; C23C 16/509;
C23C 16/5096; C23C 16/45565; H01L
21/67069
USPC ..... 118/723 E, 723 ER; 156/345.43, 345.44,
156/345.45, 345.46, 345.47
See application file for complete search history.

(56) References Cited

U.S. PATENT DOCUMENTS

| | | | | |
|---|---|---|---|---|
| 8,251,012 | B2 * | 8/2012 | Ishimaru | ............... C23C 16/509 |
| | | | | 156/345.46 |
| 10,961,626 | B2 * | 3/2021 | Jo | .......................... C23C 16/505 |
| 11,183,372 | B2 * | 11/2021 | Kang | ...................... C23C 16/50 |
| 2008/0286980 | A1 * | 11/2008 | Ishimaru | ............... B21F 45/006 |
| | | | | 156/345.43 |
| 2009/0071405 | A1 * | 3/2009 | Miyashita | ......... H01J 37/32559 |
| | | | | 118/723 R |
| 2019/0108985 | A1 * | 4/2019 | Kang | ................ H01J 37/32559 |
| 2019/0157049 | A1 * | 5/2019 | Sato | .................... H01L 21/0217 |

FOREIGN PATENT DOCUMENTS

| | | | |
|---|---|---|---|
| JP | 2018107304 | A | 7/2018 |
| KR | 101145538 | B1 | 5/2012 |
| KR | 20130067600 | A | 6/2013 |
| KR | 20150051834 | A | 5/2015 |
| KR | 101931692 | B1 | 12/2018 |
| KR | 20190032922 | A | 3/2019 |
| KR | 20200029994 | A | 3/2020 |
| TW | 201944456 | A | 11/2019 |

* cited by examiner (a)

(b)

130 : 131, 132, 133

BATCH TYPE SUBSTRATE PROCESSING APPARATUS

CROSS-REFERENCE TO RELATED APPLICATION

This application claims priority to Korean Patent Application No. 10-2020-0139301 filed on Oct. 26, 2020 and all the benefits accruing therefrom under 35 U.S.C. § 119, the contents of which are incorporated by reference in their entirety.

BACKGROUND

The present disclosure relates to a batch type substrate processing apparatus, and more particularly, to a batch type substrate processing apparatus that supplies a process gas decomposed in a discharge space, which is separated from a processing space, into the processing space.

In general, a substrate processing apparatus that locates a substrate to be processed within a processing space to deposit reaction particles contained in a process gas injected into the processing space by using chemical vapor deposition (CVD) or atomic layer deposition (ALD). The substrate processing apparatus is classified into a single wafer type substrate processing apparatus, which is capable of performing a substrate processing process on one substrate, and a batch type substrate processing apparatus, which is capable of performing a substrate processing process on a plurality of substrates at the same time.

In the batch type substrate processing apparatus, a wall surface of the processing space as well as the substrate increases in temperature by a hot wall type heating unit surrounding the processing space. As a result, undesired thin films are formed on the inner wall surface of the processing space by the process gases. Particularly, when a process environment such as plasma is created in the processing space, the thin film deposited on the inner wall are separated as particles by magnetic fields or electric fields generated in a plasm generation space to serve as contaminants during the substrate processing process. As a result, quality of the thin film on the substrate may be deteriorated, and also, efficiency of the substrate processing process may be deteriorated.

PRIOR ART DOCUMENT

Patent Document

Korean Patent No. 10-1145538

SUMMARY

The present disclosure provides a batch type substrate processing apparatus that supplies a process gas decomposed in a discharge space, which is separated from a processing space, into the processing space.

In accordance with an exemplary embodiment, a batch type substrate processing apparatus includes: a reaction tube configured to provide a processing space in which a plurality of substrates are accommodated; and a plasma forming part having a discharge space, which is distinguished from the processing space by a partition wall extending in a longitudinal direction of the reaction tube, and configured to generate plasma in the discharge space by a plurality of electrodes extending in the longitudinal direction of the reaction tube, wherein the plurality of electrodes comprise: a plurality of power supply electrodes spaced apart from each other; and a plurality of ground electrodes provided between the plurality of power supply electrodes.

The plurality of ground electrodes may be provided to be spaced apart from the plurality of power supply electrodes, and the plurality of electrodes may be configured to generate capacitively coupled plasma (CCP) in each space between the power supply electrode and the ground electrode, which are spaced apart from each other.

The plurality of ground electrodes may be spaced apart from each other.

A spaced distance between the plurality of ground electrodes may be less than or equal to a spaced distance between the power supply electrode and the ground electrode.

The batch type substrate processing apparatus may further comprise an electrode protection part configured to protect the plurality of power supply electrodes and the plurality of ground electrodes, wherein the electrode protection part may include: a plurality of first electrode protection tubes configured to surround the plurality of power supply electrodes, respectively; a plurality of second electrode protection tubes configured to surround the plurality of ground electrodes, respectively; and a bridge part configured to connect the first electrode protection tube and the second electrode protection tube, which face each other, to each other.

The bridge part may be configured to allow the first electrode protection tube and the second electrode protection tube to communicate with each other, and the batch type substrate processing apparatus may further include: a protection gas supply part connected to one electrode protection tube of the first electrode protection tube and the second electrode protection tube, which communicate with each other by the bridge part, to supply a protection gas; and a protection gas discharge part connected to the other electrode protection tube of the first electrode protection tube and the second electrode protection tube to discharge the protection gas supplied into the one electrode protection tube.

The protection gas may include an inert gas.

The batch type substrate processing apparatus may further include: a high frequency power source part configured to supply high frequency power; and a power distribution part provided between the high frequency power source part and the plurality of power supply electrodes and configured to distribute the high frequency power supplied from the high frequency power source part so as to provide the distributed high frequency power to each of the plurality of power supply electrodes.

The power distribution part may include a variable capacitor provided between a distribution point, at which the high frequency power is distributed to each of the plurality of power supply electrodes, and at least one of the plurality of power supply electrodes.

The batch type substrate processing apparatus may further include a control part configured to selectively adjust high frequency power applied to each of the plurality of power supply electrodes in accordance with a state of the plasma.

The batch type substrate processing apparatus may further include a plurality of gas supply tubes configured to supply the process gas decomposed by the plasma toward each of the spaces between the power supply electrodes and the ground electrodes, through a discharge hole.

The plasma forming part may include a plurality of injection holes, which are provided to be dislocated with respect to a discharge direction of the discharge hole, and are arranged in the longitudinal direction of the reaction tube to supply radicals of the process gas decomposed by the plasma to the processing space.

The batch type substrate processing apparatus may further include a plurality of gas supply tubes, which are provided outside both sides of the plurality of electrodes along a circumferential direction of the reaction tube to supply the process gas decomposed by the plasma into the discharge space through a discharge hole.

The plurality of gas supply tubes may be symmetrically disposed at both sides of a radial direction extending from a central axis of the reaction tube to a center of the discharge space.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
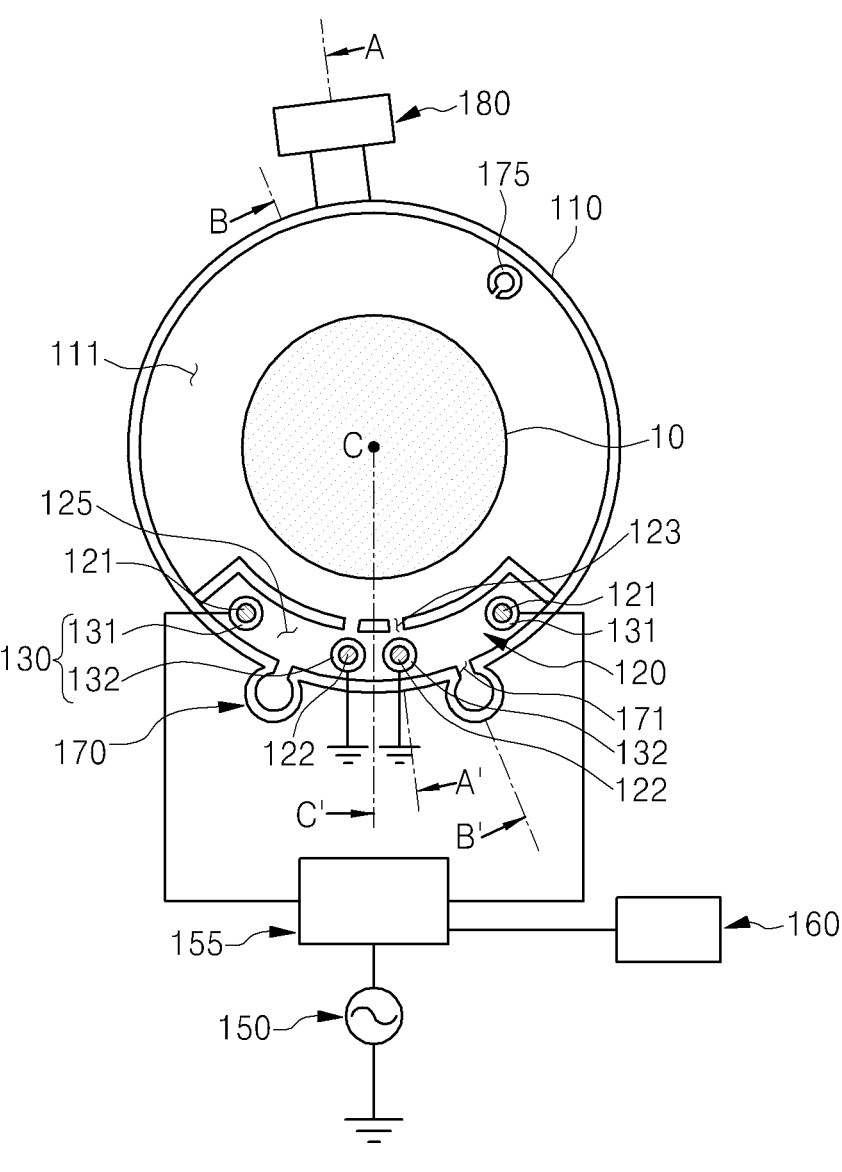
FIG. 1 is a horizontal cross-sectional view of a substrate processing apparatus in accordance with an exemplary embodiment.

Hereinafter, specific embodiments will be described in more detail with reference to the accompanying drawings. The present inventive concept may, however, be embodied in different forms and should not be construed as limited to the embodiments set forth herein. Rather, these embodiments are provided so that this disclosure will be thorough and complete, and will fully convey the scope of the present inventive concept to those skilled in the art. In the descriptions, the same elements are denoted with the same reference numerals. In the figures, the dimensions of layers and regions are exaggerated for clarity of illustration. Like reference numerals refer to like elements throughout.

Figure 2:
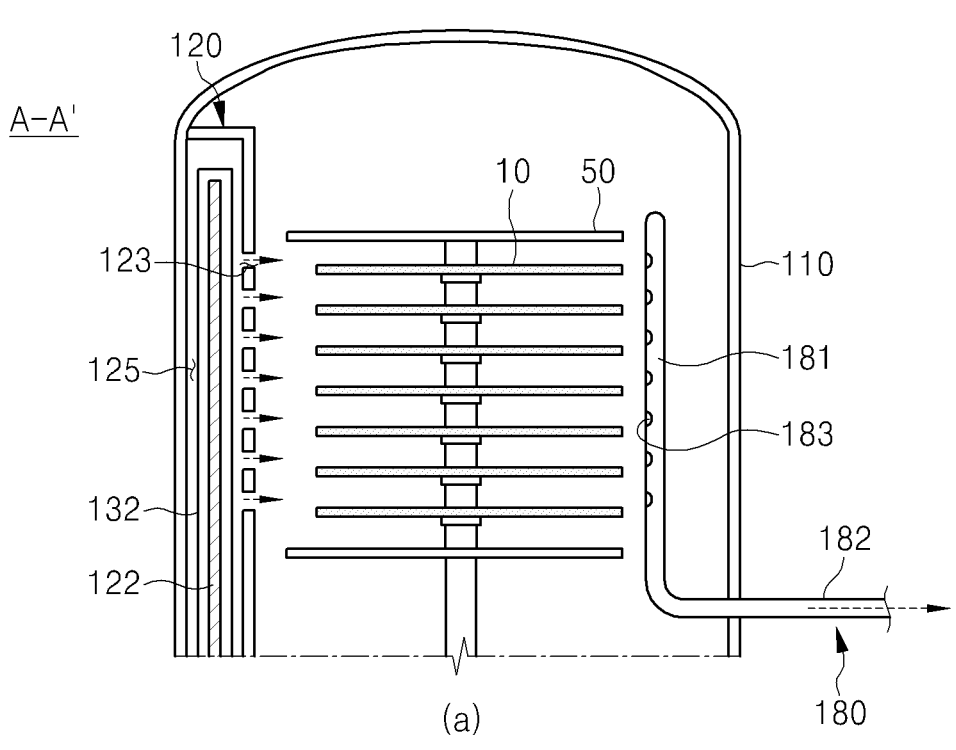
FIG. 2 is a side cross-sectional view of the substrate processing apparatus in accordance with an exemplary embodiment.
Figure 2:
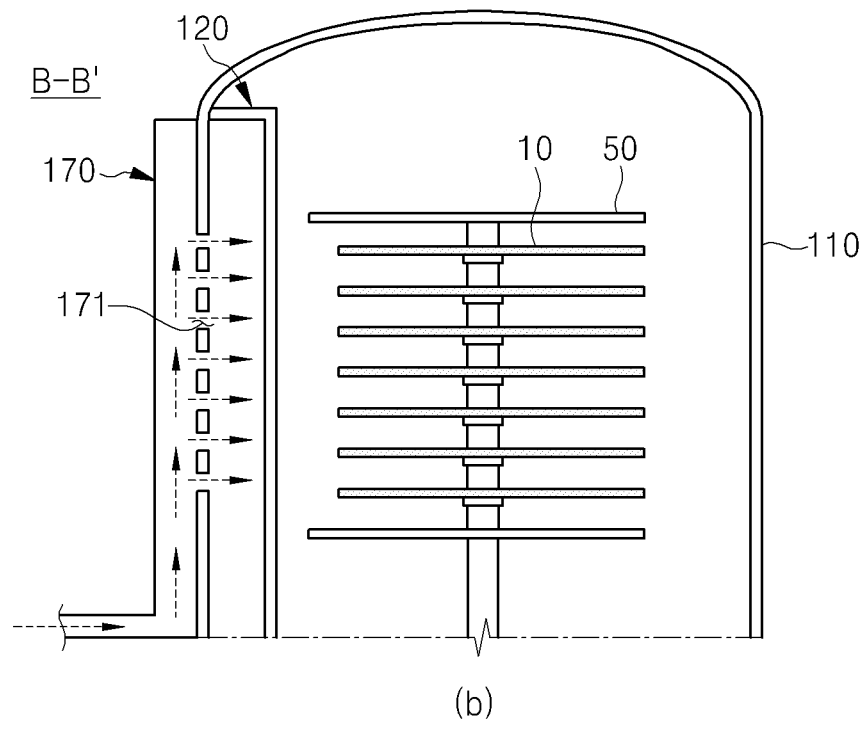

FIG. 1 is a horizontal cross-sectional view of a substrate processing apparatus in accordance with an exemplary embodiment, and FIG. 2 is a side cross-sectional view of the substrate processing apparatus in accordance with an exemplary embodiment. Here, (a) of FIG. 2 is a side cross-sectional view taken along line A-A' of FIG. 1, and (b) of FIG. 2 is a side cross-sectional view taken along line B-B' of FIG. 1.

Referring to FIGS. 1 and 2, a batch type substrate processing apparatus 100 in accordance with an exemplary embodiment may include a reaction tube 110 providing a processing space 111, in which a plurality of substrates 10 are accommodated, and a plasma forming part 120 having a discharge space 125, which is separated from the processing space 111 by a partition wall 115 extending in a longitudinal direction of the reaction tube 110, and generating plasma in the discharge space 125 by the plurality of electrodes 121 and 122 extending in the longitudinal direction of the reaction tube 110.

The reaction tube 110 may have a cylindrical shape with a closed upper portion and an opened lower portion and made of a heat resistance material such as quartz or ceramic and may provide the processing space 111 in which the plurality of substrates 10 are accommodated to be processed. The processing space of the reaction tube 110 may be a space in which the substrate boat 50, on which the plurality of substrates 10 are laminated in the longitudinal direction of the reaction tube 110, are accommodated, and also, an actual processing process (for example, a deposition process) is performed.

Here, the substrate boat 50 may be configured to support the substrates 10 and be provided so that the plurality of substrates 10 are laminated in the longitudinal direction (i.e., a vertical direction) of the reaction tube 110 and also provide a plurality of processing spaces in which the plurality of substrates 10 are individually processed.

The plasma forming part 120 may generate plasma using the plurality of electrodes 121 and 122 and may decompose the process gas supplied from the gas supply tube 170 by the plasma to provide the decomposed process gas to the processing space 111 in the reaction tube 110. The plasma forming part 120 may have a discharge space 125 separated from the processing space 111 by the partition wall 115 extending in the longitudinal direction of the reaction tube 110. Here, the plasma forming part 120 may generate plasma in the discharge space 125 by the plurality of electrodes 121 and 122 extending in the longitudinal direction of the reaction tube 110, and the plurality of electrodes 121 and 122 may be disposed in a circumferential direction of the reaction tube 110. For example, the plurality of electrodes 121 and 122 may have bar shapes extending in the longitudinal direction of the reaction tube 110 and may be disposed side by side (or in parallel).

The discharge space 125 of the plasma forming part 120 may be a space in which the plasma is generated and may be separated from the processing space 111 by the partition wall 115. Thus, the plasma forming part 120 may decompose the process gas supplied from the gas supply tube 170 using the plasma in the discharge space 125 and may provide only radicals of the decomposed process gas into the processing space 111.

Here, the partition wall 115 may extend in the longitudinal direction of the reaction tube 110, be disposed inside the reaction tube 110, or be disposed outside the reaction tube 110. For example, the partition wall 115 may be disposed inside the reaction tube 110 to define the discharge space 125 together with an inner wall of the reaction tube 110, as illustrated in FIG. 1, and may include a plurality of sub sidewalls 115a and 115b connected to the inner wall (or inner surface) of the reaction tube 110 and a main sidewall 115c between the plurality of sub sidewalls 115a and 115b. The plurality of sub sidewalls 115a and 115b may protrude (or extend) from the inner wall of the reaction tube 110 to the inside of the reaction tube 110 and may be spaced apart from each other to be disposed in parallel. In addition, the main sidewall 115c may be spaced apart from the inner wall of the reaction tube 110 and disposed between the plurality of sub sidewalls 115a and 115b. Here, both the plurality of sub sidewalls 115a and 115b and the main sidewall 115c may extend along the inner wall of the reaction tube 110 in the longitudinal direction of the reaction tube 110. However, the partition wall 115 may be provided in various shapes without being limited to the shape illustrated in FIG. 1 as long as the partition wall 135 provides the discharge space that is separated from the processing process. In another embodiment, the partition wall 115 may be disposed outside the reaction tube 110 to define the discharge space 125 together with an outer wall of the reaction tube 110 and may include a plurality of sub sidewalls 115a and 115b connected to an outer surface (or outer wall) of the reaction tube 110 and a main sidewall 115c between the plurality of sub sidewalls 115a and 115b. The plurality of secondary sidewalls 115a and 115b may protrude from the outer wall of the reaction tube 110 to the outside of the reaction tube 110 and may be spaced apart from each other to be disposed in parallel. In addition, the main sidewall 115c may be spaced apart from the outer wall of the reaction tube 110 and disposed between the plurality of sub sidewalls 115a and 115b. The main sidewall 115c is provided in the form of a tube having a diameter less or greater than that of the reaction tube 110 to define the discharge space 125 between the sidewall of the reaction tube 110 and the main sidewall 115c (i.e., between the inner wall of the reaction tube and the main sidewall or between the outer wall of the reaction tube and the main sidewall).

The plasma forming part 120 may generate the plasma in the discharge space 125 separated from the processing space 111 by the partition wall 115 so that the process gas supplied from the gas supply tube 170 is not directly supplied into the reaction tube 110 to be decomposed in the processing space 111, but is decomposed in the discharge space 125 that is a space separated from the processing space 111 and then supplied into the processing space 111. Thus, when the plasma is generated in the processing space 111 by directly supplying the process gas into the processing space 111, the thin film formed on the inner wall of the processing space 111 may be separated as particles by magnetic or electric fields due to the plasma.

In addition, the plurality of electrodes 121 and 122 may include a plurality of power supply electrodes 121 spaced apart from each other and a plurality of ground electrodes 122 provided between the plurality of power supply electrodes 121. The plurality of power supply electrodes 121 may be spaced apart from each other, and a high frequency power (or RF power) may be applied to each of the plurality of power supply electrodes 121.

The plurality of ground electrodes 122 may be provided between the plurality of power supply electrodes 121 spaced apart from each other and may be grounded. Here, the plurality of ground electrodes 122 may be respectively grounded or may be commonly grounded. For example, two ground electrodes 122 may be provided in a space in which the two power supply electrodes 121 are spaced apart from each other, and the ground electrode 122 corresponding to each of the power supply electrodes 121 may be provided. As a result, the plasma may be generated between the power supply electrode 121 and the ground electrode 122, which correspond to each other and are paired.

That is, the plurality of power supply electrodes 121 and the plurality of ground electrodes 122 may have a four-electrode structure, and the high frequency power may be divided to be supplied to the plurality of power supply electrodes 121 to reduce high frequency power that is required to generate plasma or high frequency power for obtaining desired positive radicals, thereby the particles due to the high frequency power from occurring.

In detail, as in the present disclosure, when the plurality of power supply electrodes 121 and the plurality of ground electrodes 122 have the four-electrode structure, the high frequency power that is required to generate the plasma for decomposing the process gas or is required to obtain the desired positive radicals may be reduced half or significantly to prevent the electrode protection part 130, the partition wall 115, and the reaction tube 110 from being damaged by the high frequency power. In addition, the occurrence of particles due to the damage of the electrode protection part 130, the partition wall 115, and the reaction tube 110 may be prevented. For example, if the power required to decompose the process gas with sufficient energy is 100 W, when the four-electrode electrode in which the plurality of ground electrodes are disposed between the plurality of power supply electrodes 121 is provided, power of 50 W less than that of 100 W may be supplied to each of the power supply electrodes 121. As a result, even though power loss than the power that is required to generate the plasma is supplied, the same amount of radicals as that when the power of 100 W is supplied may be finally obtained. In addition, since low power of 50 W is supplied to each of the power supply electrodes 121, the process gas may be more effectively decomposed without generating the particles due to the high voltage.

Figure 3:
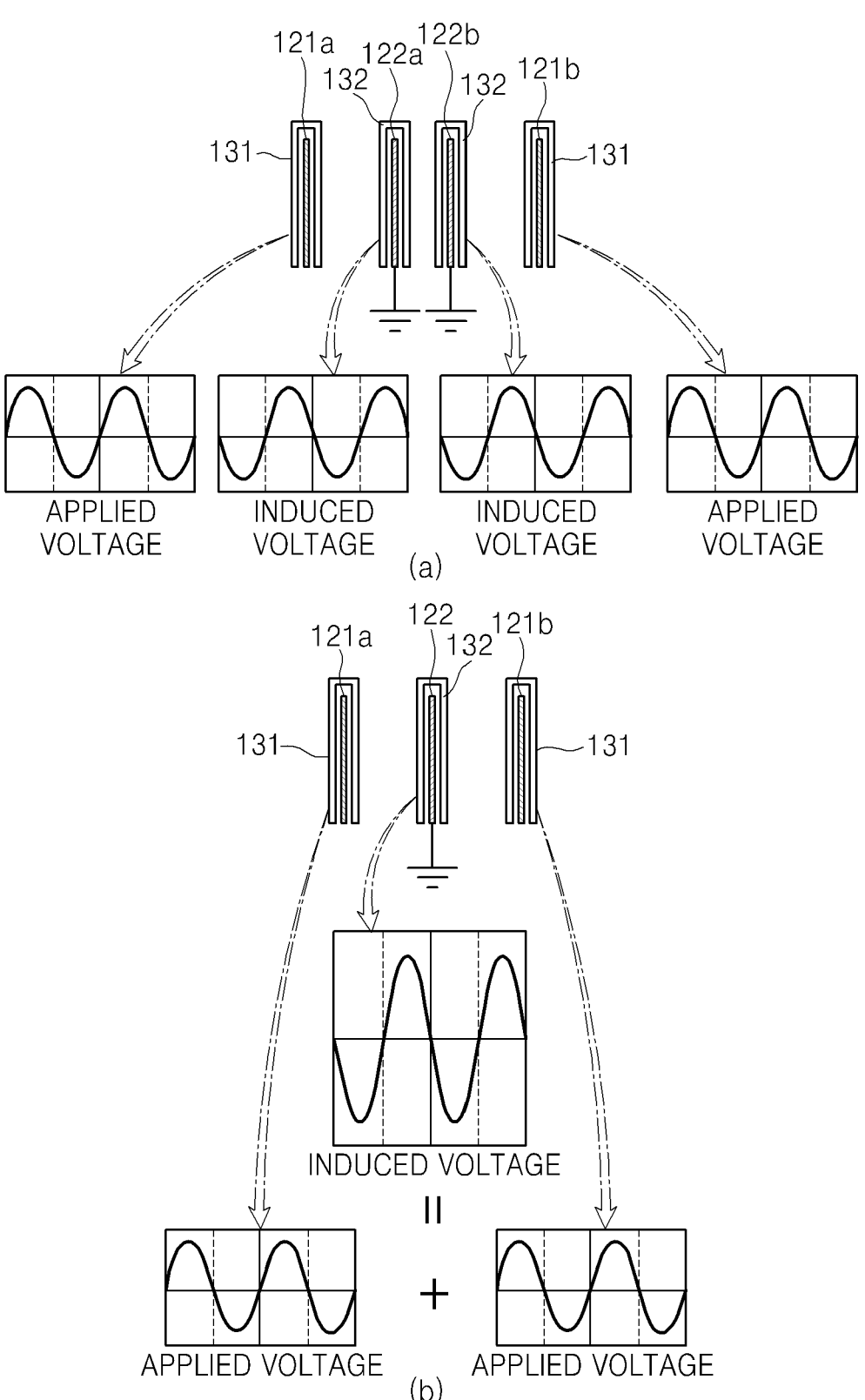
FIG. 3 is a conceptual view for explaining a voltage waveform induced into a ground electrode depending on the number of plurality of electrodes in accordance with an exemplary embodiment.

FIG. 3 is a conceptual view for explaining a voltage waveform induced into the ground electrode depending on the number of plurality of electrodes in accordance with an exemplary embodiment. Here, (a) of FIG. 3 illustrates the four-electrode structure, and (b) of FIG. 3 illustrates a three-electrode structure.

Referring to FIG. 3, it is seen that a voltage waveform induced to the ground electrode is different in the four-electrode structure of (a) of FIG. 3 and the three-electrode structure of (b) of FIG. 3.

In detail, in the three-electrode structure as illustrated in (b) of FIG. 3, when the same high frequency power is simultaneously applied to the two power supply electrodes 121a and 121b, power applied to the first power supply electrode 121a and power applied to the second power supply electrode 121b may be combined (or merged), and thus, double voltage may be induced to the common ground electrode 122. That is, in the three-electrode structure using the common ground electrode 122, the voltage applied to the first power supply electrode 121a and the voltage applied to the second power supply electrode 121b have the same phase difference, and thus, electric fields greater than those of the two power supply electrodes 121a and 122b may be induced to the ground electrode 122. In addition, due to the undesired high electric fields, the plasma potential increases in proportion to the electric fields, and thus the plasma damage occurs. Particularly, the plasma damage may occur to damage the second electrode protection tube 132, the partition wall 115, the reaction tube 110, which are disposed around the ground electrode 122, to which the double voltage is induced.

On the other hand, as illustrated in (a) of FIG. 3, in the four-electrode structure in accordance with an exemplary embodiment, a voltage (i.e., the same voltage as that applied to each of the first power supply electrode and the second power supply electrode) corresponding to a half level of the voltage induced to the ground electrode 122 may be induced to the two ground electrodes 122a and 122b. Thus, the plasma damage occurring due to the high electric fields by the high voltage during plasma generation (turn on) and plasma maintenance may be suppressed or prevented. That is, the same voltage as the voltage applied to the first power supply electrode 121a may be induced to the first ground electrode 122a by the voltage applied to the first power supply electrode 121a. In addition, the same voltage as the voltage applied to the second power supply electrode 121b may be induced to the second ground electrode 122b by the voltage applied to the second power supply electrode 121b.

In addition, in the case of the three-electrode structure, the three electrodes may interfere with each other, but in the case of the four-electrode structure, the first power supply electrode 121a and the first ground electrode 122a may be paired, and the second power supply electrode 121b and the second ground electrode 122b may be paired, and thus, only electrodes corresponding to each other at a close distance may act on each other, but the electrodes, which do not correspond to each other at a long distance, may have little effect on each other. In addition, there may be little influence of interference between the power supply electrodes 121a and 121b and the ground electrodes 122b and 122a, which do not correspond to each other. For reference, in principle of electromagnetic fields and an electric circuit, the power supply electrode 121 acts with the closest ground electrode 122.

Here, the plurality of ground electrodes 122 may be provided to be spaced apart from the plurality of power supply electrodes 121, and each of the plurality of electrodes 121 and 122 may generate capacitively coupled plasma (CCP) in each space between the power supply electrode 121 and the ground electrode 122, which are spaced apart from each other. Each of the plurality of ground electrodes 122a and 122b may be provided to be spaced apart from the plurality of power supply electrodes 121a and 121b. Here, the power supply electrode 121 and the ground electrode 122 may be spaced apart from each other to provide a plasma generation space, and the plurality of power supply electrodes 121a and 121b and the plurality of ground electrodes 122a and 122b may define a plasma generating spaces.

Also, the plurality of electrodes 121 and 122 may generate the capacitively coupled plasma (CCP) in each the space (i.e., plasma generation space) between the power supply electrode 121 and the ground electrode 122, which are spaced apart from each other. Here, high frequency power may be applied to each of the plurality of power supply electrodes 121, and thus, the capacitively coupled plasma (CCP) may be generated by the electric fields generated in the space between the power supply electrode 121 and the ground electrode 121, which face (or correspond to) each other.

Here, unlike the capacitively coupled plasma (CCP) method in which plasma is generated by obtaining energy from electron acceleration generated by the electric fields generated in the space between the power supply electrode 121 and the ground electrode 122, which are spaced apart from (or separated from) each other, in an inductively coupled plasma (ICP) method, plasma is generated from electric fields generated around magnetic fields when the magnetic fields generated by electric current flowing through antennas connected to each other are changed with time. In general, in the inductively coupled plasma (ICP) method, the plasma is generated by an E-mode and converted to an H-mode to generate high-density plasma. The inductively coupled plasma (ICP) method is divided into the E-mode and the H-mode according to plasma density or applied power. In order to perform the mode conversion from the E-mode with low-plasma density to the H-mode with high-plasma density, high power has to be induced. In addition, when input power increases, a number of radicals that do not participate in the reaction in accordance with particles and a high electron temperature are generated to cause limitations, in which it difficult to obtain a good quality film, and it is difficult to generate uniform plasma in accordance with the electric fields generated by the antenna.

However, in the present disclosure, since the capacitively coupled plasma (CCP) is generated in each of the spaces (i.e., the plasma generation spaces) between the power supply electrodes 121 and the ground electrodes 122, it may be difficult to induce high power for performing the mode conversion as in the inductively coupled plasma (ICP). As a result, it is more effective in preventing the generation of the particles and obtaining the good quality film by generating a large number of radicals participating in the reaction in accordance with the low electron temperature.

Also, the plurality of ground electrodes 122a and 122b may be spaced apart from each other and may be physically separated from each other. Here, the meaning of the 'spacing' or the 'separation' does not mean one body, and but means that a distance between each other is very narrow and greater than 0.

When the plurality of ground electrodes 122a and 122b are attached to each other without being spaced apart from each other, the plurality of ground electrodes 122a and 122b may interfere with each other, and the plurality of ground electrodes 122a and 122b may interfere with the power supply electrodes 121b and 121a, which do not correspond thereto. For example, the voltage applied to the first power supply electrode 121a and the voltage applied to the second power supply electrode 121b may be combined in the first ground electrode 122a and the second ground electrode 122b (i.e., the plurality of ground electrodes), and thus, almost double voltage may be induced to the first ground electrode 122a and the second ground electrode 122b (e.g., the plurality of ground electrodes). In this case, the plasma potential that is in proportion to the electric fields may increase due to the high electric fields, and thus, the plasma damage may occur to damage the second electrode protection tube 132, the partition wall 115, and the reaction tube 110, which are disposed around the plurality of ground electrodes 122a and 122b, to which the double voltage is induced. Here, in the case of the four-electrode structure, since a total volume of the ground electrodes 122a and 122b increases compared to the case of the three-electrode structure, a lower voltage less than that in the three-electrode structure may be induced to the plurality of ground electrodes 122a and 122b.

However, When the plurality of ground electrodes 122a and 122b are spaced apart from each other, the interference between the plurality of ground electrodes 122a and 122b may be suppressed or prevented, and the interference between the plurality of ground electrodes 122a and 122b with the power supply electrodes 121b and 121a, which do not correspond thereto, may be suppressed or prevented. That is, there is no interference between the plurality of ground electrodes 122a and 122b, and there is no interference between the power supply electrodes 121b and 121a that do not correspond to the plurality of ground electrodes 122a and 122b, and thus, the same voltage as that applied to the first power supply electrode 121a may be induced to only the first ground electrode 122a by the voltage applied to the first power supply electrode 121a. In addition, the same voltage as the voltage applied to the second power supply electrode 121b may be induced to only the second ground electrode 122b by the voltage applied to the second power supply electrode 121b. Thus, the plasma damage occurring due to the high electric fields by the high voltage during plasma generation and plasma maintenance may be suppressed or prevented.

Here, a spaced distance between the plurality of ground electrodes 122 may be less than or equal to that between the power supply electrode 121 and the ground electrode 122. When the spaced distance between the plurality of ground electrodes 122 is greater than that between the power supply electrode 121 and the ground electrode 122, relatively low plasma density is generated in a space between the plurality of ground electrodes 122, and the plasma density and/or radical density in the discharge space 125 may not be uniformly generated. For this reason, an amount of radicals supplied to each of the injection hole 122 of the plasma forming part 120 may vary, and nonuniform processing (or deposition) may occur between the plurality of substrates 10. In addition, a width of the discharge space 125 (or a width of the plasma forming part) is inevitably limited due to the structure of the batch type substrate processing apparatus 100, and when the spaced distance between the plurality of ground electrodes 122 increases, since the spaces between the power supply electrodes 121 and the ground electrodes 122, which are the plasma generation spaces, are relatively reduced, the process gas may not be effectively decomposed, and thus, the radicals may not be effectively obtained.

Thus, the spaced distance between the plurality of ground electrodes 122 may be less than or equal to that between the power supply electrode 121 and the ground electrode 122. As a result, the process gas may be effectively decomposed to effectively obtain the radicals without the interference between the plurality of ground electrodes 122a and 122b and the interference between the power supply electrodes 121a and 121b and the ground electrodes 122b and 122a, which do not correspond to each other, and the plasma density and/or radical density within the discharge space 125 may be uniformly generated. Thus, the nonuniform processing between the plurality of substrates 10 may be prevented to improve processing (or deposition) uniformity between the plurality of substrates 10.

Therefore, in the batch type substrate processing apparatus 100 in accordance with an exemplary embodiment, the plurality of ground electrodes 122 may be provided between the plurality of power supply electrodes 121 spaced apart from each other to provide the plurality of power supply electrodes 121a and 121b, which correspond to the plurality of power supply electrodes 121a and 121b, and thus, the ground electrode 122 may be commonly used to prevent the double electric fields from being induced into the ground electrode 122. Therefore, the plasma damage generated due to the plasma potential, which increases in proportion to the electric fields, may be suppressed or prevented, and thus, the lifespan of the plasma forming part may extend. In addition, a sputtering effect may be reduced by using the plurality of power supply electrodes 121 to lower the applied voltage, and the process time may be shortened by using the high plasma density and radicals.

Figure 4:
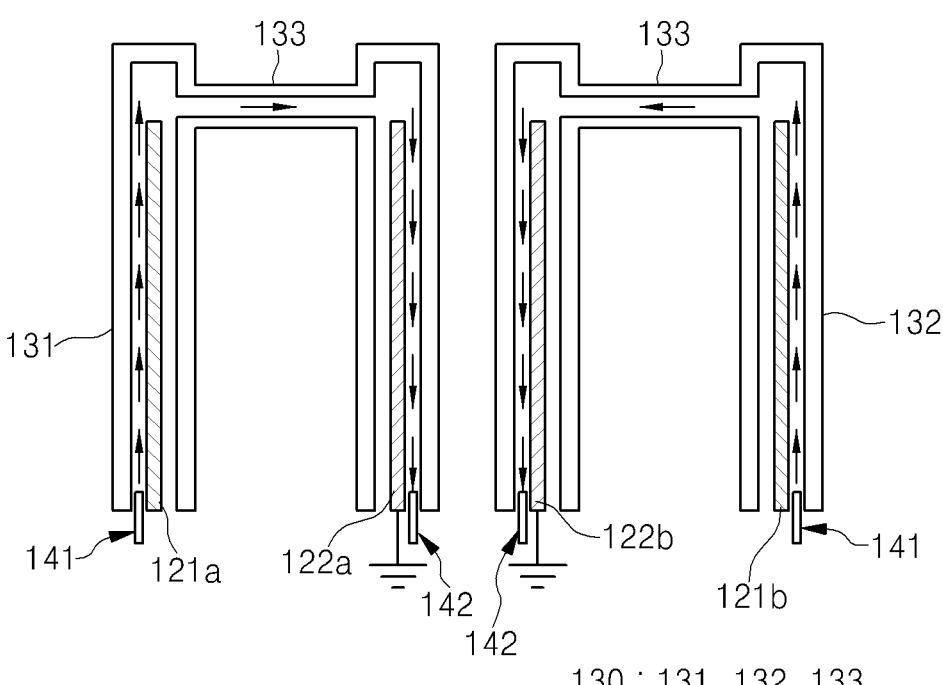
FIG. 4 is a conceptual view for explaining an electrode protection part in accordance with an exemplary embodiment.

FIG. 4 is a conceptual view for explaining the electrode protection part in accordance with an exemplary embodiment.

Referring to FIG. 4, the batch type substrate processing apparatus 100 in accordance with an exemplary embodiment may further include an electrode protection part 130 that protects the plurality of power supply electrodes 121 and the plurality of ground electrodes 122.

The electrode protection part 130 may protect the plurality of power supply electrodes 121 and the plurality of ground electrodes 122 and may surround at least a portion of each of the plurality of power supply electrodes 121 and the plurality of ground electrodes 122 to protect each of the plurality of power supply electrodes 121 and the plurality of ground electrodes 122.

Here, the electrode protection part 130 may include a plurality of first electrode protection tubes 131, which surround the plurality of power supply electrodes 121a and 121b, respectively, a plurality of second electrode protection tubes 132, which surrounds the plurality of ground electrodes 122a and 122b, respectively, and a bridge part 133 connecting the first electrode protection tube 131 and the second electrode protection tube 132, which face each other, to each other. The plurality of first electrode protection tubes 131 may surround an outer circumferential surface of each of the plurality of power supply electrodes 121a and 121b to protect each of the plurality of power supply electrodes 121. P In addition, the plurality of second electrode protection tubes 132 may surround an outer circumferential surface of each of the plurality of ground electrodes 122a and 122b to protect each of the plurality of ground electrodes 122.

For example, each of the plurality of power supply electrodes 121 and the plurality of ground electrodes 122 may be protected to be surrounded by the first electrode protection tube 131 and/or the second electrode protection tube 132 from the top to the bottom. Here, each of the plurality of power supply electrodes 121 and the plurality of ground electrodes 122 may be made of a flexible braided wire.

In general, electrical conduction due to the use of a high-frequency power source may cause a skin effect in which current flows along a surface (or may be affected by a depth of penetration of metal, which is a depth through which current flows). Here, when a net-type mesh electrode is used, since an area occupied by an empty space is wide, the RF power is inefficiently applied by large resistance due to a small surface area. Furthermore, the substrate processing process is repeatedly performed at high and low temperatures, and when the electrode is provided as a net type, a shape of the net-type electrode is irregularly changed in accordance with a change in temperature, which is disadvantageous in terms of shape maintenance. In addition, there is a limitation in that nonuniform plasma is generated when high frequency power is applied because resistance varies in accordance with the changed shape.

In order to prevent these limitations, the plurality of power supply electrodes 121 and the plurality of ground electrodes 122 may be not only inserted into the first electrode protection tube 131 and/or the second electrode protection tube 132, but also minimize the empty space, and thus be provided in the braided type (braided wire) having flexibility. For example, in order to further reduce the empty space, a method of applying a metal on the surface of each of the electrodes may be additionally performed. In addition, a spring part (not shown) that fixes and supports both ends of each of the plurality of power supply electrodes 121 and the plurality of ground electrodes without movement may be further provided so that the plurality of power supply electrodes 121 and a plurality of ground electrodes 122, which are provided in flexible braided-type, extend in the longitudinal direction of the reaction tube 110 inside the discharge space 125 so as to be maintained in the fixed state. Here, the plurality of flexible power supply electrodes 121 and the plurality of flexible ground electrodes 122 may be respectively fixed in the longitudinal direction of the reaction tube 110 by the spring part and then be maintained in a thin and elongated rod shape.

The first electrode protection tube 131 and the second electrode protection tube 132 surround the outside of the power supply electrode 121 and the outside of the ground electrode 122, respectively, to protect each of the plurality of power supply electrodes 121 and the plurality of ground electrodes 122, which are exposed to the plasma atmosphere, from the plasma while electrically insulating each of the power supply electrodes 121 and the plurality of ground electrodes 122. Thus, the plurality of power supply electrodes 121 and the plurality of ground electrodes 122 may be safely protected from contamination or particles that may be generated by plasma. Here, each of the first electrode protection tube 131 and the second electrode protection tube 132 may be made of a heat-resistant material such as quartz or ceramic and may be manufactured to be integrated with the reaction tube 110.

The bridge part 133 may connect the first electrode protection tube 131 and the second electrode protection tube 132, which face each other, to each other and may maintain a gap between the first electrode protection tube 131 and the second electrode protection tube 132. Thus, the distance between the power supply electrode 121 and the ground electrode 122 that interact with each other to generate plasma may be constantly maintained, and a pair of power supply electrode 121 and ground electrode 122, which correspond to each other, may have the same distance. Here, the first electrode protection tube 131 and the second electrode protection tube 132, which face each other refer to the electrode protection tubes 131 and 132 into which the power supply electrode 121 and the ground electrode 122, which interact with each other to generate the plasma in the space therebetween, are inserted. That is, the power supply electrode 121 may act with the nearest ground electrode 122 to generate plasma in the space therebetween.

In order to obtain the uniform plasma density in the discharge space 125, the spaces between the power supply electrodes 121 and the ground electrodes 122 have to have the same volume (or area). In addition, it is necessary that the plasma (or plasma potential) having the same intensity may be generated in the spaces between the power supply electrodes 121 and the ground electrodes 122 to generate plasma having uniform density in the spaces (or the plasma generation spaces) between the power supply electrodes 121 and the ground electrodes 122. For this, the first electrode protection tube 131 and the second electrode protection tube 132 may be connected to each other through the bridge part 133 to maintain the distance between the first electrode protection tube 131 and the second electrode protection tube 132. Thus, the distance between the power supply electrode 121 and the ground electrode 122 that interacts with each other to generate plasma in the space therebetween, may be constantly maintained, and the spaces between the power supply electrodes 121 and the ground electrodes 122 may have the same volume to generate the plasma having the uniform density in the plurality of plasma generation spaces.

In addition, the bridge part 133 may connect the first electrode protection tube 131 to the second electrode protection tube 132 as well as allow the first electrode protection tube 131 and the second electrode protection tube 132 to communicate with each other so that a gas flows between the first electrode protection tube 131 and the second electrode protection tube 132. For example, a gas passage, in which inner walls (or inner surfaces) of the first electrode protection tube 131 and the second electrode protection tube 132 are respectively spaced apart from the power supply electrode 121 and the ground electrode 122 (or surfaces of the power supply electrode and the ground electrode) so that a gas flows, may be provided in each of the first electrode protrusion tube 131 and the second electrode protection tube 132. In addition, a gas passage having a tube shape may be provided in the bridge part 133 to allow the gas passage of the first electrode protection tube 131 and the gas passage of the second electrode protection tube 131 to communicate with each other.

In addition, the batch type substrate processing apparatus 100 in accordance with an exemplary embodiment may further include a protection gas supply part 141 connected to one electrode protection tube 131 or 132 of the first electrode protection tube 131 and the second electrode protection tube 132, which communicate with each other by the bridge part 133, to supply a protection gas, and a protection gas discharge part 142 connected to the other electrode protection tube 132 or 131 of the electrode protection tube 131 and the second electrode protection tube 132 to discharge the protection gas supplied to the one electrode protection tube 131 or 132.

The protection gas supply part 141 may be connected to one electrode protection tube 131 or 132 of the first electrode protection tube 131 and the second electrode protection tube 132, which communicate with each other by the bridge part 133, to supply the protection gas. The substrate processing process may be performed at a high temperature of approximately 600° C. or more, and the power supply electrode 121 and/or the ground electrode 122 made of a metal such as nickel (Ni) may be oxidized at a high temperature of approximately 600° C. or more. Accordingly, it is possible to prevent oxidation of the power supply electrode 121 and the ground electrode 122 by supplying the protection gas into one electrode protection tube 131 or 132 through the protection gas supply part 141. Here, the protection gas supplied to one electrode protection tube 131 or 132 may flow to the other electrode protection tube 132 or 131 via the bridge part 133 (or through the bridge part).

The protection gas discharge part 142 is connected to the other electrode protection tube 132 or 131 of the first electrode protection tube 131 and the second electrode protection tube 132 to discharge the protection gas supplied to one electrode protection tube 131 or 132. Here, the protection gas discharge part 142 may discharge the protection gas supplied to one electrode protection tube 131 or 132 to flow to the other electrode protection tube 132 or 131 through the bridge part 133.

In the present disclosure, a passage for the protection gas, which passes through one electrode protection tube 131 or 132, the bridge part 133, and the other electrode protection tube 132 or 131 through the protection gas supply part 141, the bridge part 133, and the protection gas discharge part 142, may be provided. Thus, the protection gas may effectively flow into the first electrode protection tube 131 and the second electrode protection tube 132 to effectively prevent the oxidation of the power supply electrode 121 and the ground electrode 122.

In the three-electrode structure in accordance with the related art, when the plurality of first electrode protection tubes 131 and the second electrode protection tubes 132 are connected to each other by the bridge part 133, a flow rate of the protection gas flowing through each of the plurality of first electrode protection tubes 131 and a flow rate of the protection gas flowing through the second electrode protection tube 132 may be different from each other. Thus, a flow of the protection gas may not be smooth due to the flow rates different from each other. As a result, the oxidation of the power supply electrode 121 and the ground electrode 122 may not be effectively prevented. In addition, the different flow rates of the protection gas in the first electrode protection tube 131 and the second electrode protection tube 132 may affect plasma formation, and effective decomposition of the process gas may not be achieved.

However, in this embodiment, since the bridge part 133 connects one first electrode protection tube 131 to one second electrode protection tube 132, the protection gas supply part 141 may be connected to one electrode protection tube 131 or 132, and the protection gas discharge part 142 may be connected to the other electrode protection tube 132 or 131 so that the flow of the protection gas passing through one electrode protection tube 131 or 132, the bridge part 133, and the other electrode protection tube 132 or 131 is smooth. Thus, the oxidation of the power supply electrode 121 and the ground electrode 122 may be effectively prevented, and the protection gas may not affect the plasma formation, and thus, the process gas may be effectively decomposed.

Here, the protection gas may include an inert gas, and the inert gas may be nitrogen ($N_2$), argon (Ar), or the like. The inert gas such as nitrogen ($N_2$) may be supplied into the first electrode protection tube 131 and the second electrode protection tube 132 to prevent oxygen ($O_2$) from being introduced into or staying in the first electrode protection tube 131 and the second electrode protection tube 132. As a result, it is possible to prevent the power supply electrode 121 and the ground electrode 122 from being oxidized by reacting with oxygen ($O_2$).

The batch type substrate processing apparatus 100 in accordance with an exemplary embodiment may further include a high frequency power source part 150 that supplies high frequency power and a power distribution part 155 disposed between the high frequency power source part 150 and the plurality of power supply electrodes 121 to distribute the high frequency power supplied from the high frequency power source part 150, thereby providing the distributed high frequency power to each of the plurality of power supply electrodes 121a and 121b.

The high frequency power source part 150 may supply high frequency power, and the supplied high frequency power may be applied (or supplied) to the plurality of power supply electrodes 121. When the high frequency power is applied to the power supply electrode 121, electric fields (or magnetic fields) may be generated between the power supply electrode 121 and the ground electrode 122, and thus, capacitively coupled plasma (CCP) may be generated by the generated electric fields.

When high frequency power is applied to each of the plurality of power supply electrodes 121 (e.g., the four-electrode structure in which the two ground electrodes are disposed between the two power supply electrodes), the high frequency power may be divided to be separately supplied to the power supply electrodes 121. Thus, power required to form (or generate) plasma or the power to obtain a desired amount of radicals may be reduced, and when compared to the case of applying a high frequency power to one power supply electrode 121, generation of particles may be reduced or prevented. In addition, since the plasma is generated in a larger (or wider) space (or area) than when the plasma is generated using one power supply electrode 121 and one ground electrode 122, the process gas may be decomposed more effectively.

For example, the high frequency power source part 150 may apply high frequency power having a frequency that is selected in range of approximately 4 MHz to approximately 40 MHz to each of the plurality of power supply electrodes 121a and 121b. When the frequency of the high frequency power is greater than approximately 40 MHz, even in the case of the four-electrode structure having two power supply electrodes 121, an imaginary part Zn' of an overall impedance Zn is too low to cause a limitation in plasma ignition. On the other hand, when the frequency of the high-frequency power source is less than 4 MHz, since the imaginary part Zn' of the overall impedance Zn is too large, even if the number of power supply electrodes 121 increases, the minimum imaginary part Zn' of the overall impedance Zn' may not be achieved. That is, a circumference (length) of the reaction tube 110 is determined in accordance with a size (or circumference) of the substrate 10, and the maximum number of power supply electrodes 121 is determined in accordance with the circumference of the reaction tube 110. For this reason, even if the imaginary part Zn' of the overall impedance Zn is reduced by increasing in number of the power supply electrodes 121 in accordance with a limit, in which the number of the power supply electrodes 121 increases, the imaginary part Zn' of the overall impedance Zn may not be reduced up to the minimum imaginary part Zn' of the overall impedance Zn.

Thus, the high frequency power source part 150 may apply high frequency power having a frequency that is selected in range of approximately 4 MHz to approximately 40 MHz to each of the plurality of power supply electrodes 121a and 121b. In addition, as the number of power supply electrodes 121 increases, the plasma generation space increases. Therefore, the same (or a certain level) plasma density has to be provided in all the plasma generating spaces for the plasma uniformity in the discharge space 125. For this, high frequency power having the same frequency (or within an error range of ±10%) may be applied to each of the power supply electrodes 121.

For example, in the case of the four-electrode structure in which two ground electrodes 122 are disposed between two power supply electrodes 121, high frequency power having a frequency of approximately about 27 MHz (or approximately 27.12 MHz) may be applied to each of the power supply electrodes 121.

The power distribution part 155 may be provided between the high frequency power source part 150 and the plurality of power supply electrodes 121 to distribute the high frequency power supplied from the high frequency power source part 150, thereby providing the distributed high frequency power to each of the plurality of power supply electrodes 121a and 121b. Here, the power distribution part 155 may be a power splitter, which is provided between the high frequency power source part 150 and the plurality of power supply electrodes 121 to distribute the high frequency power supplied (or outputted) from the high frequency power source part 150. The high frequency power distributed as described above may be provided to each of the plurality of power supply electrodes 121a and 121b. In this case, the same power (or voltage) may be applied to each of the plurality of power supply electrodes 121a and 121b, and thus, uniform plasma may be generated in the spaces between each of the power supply electrodes 121 and each of the ground electrodes 122.

Figure 5:
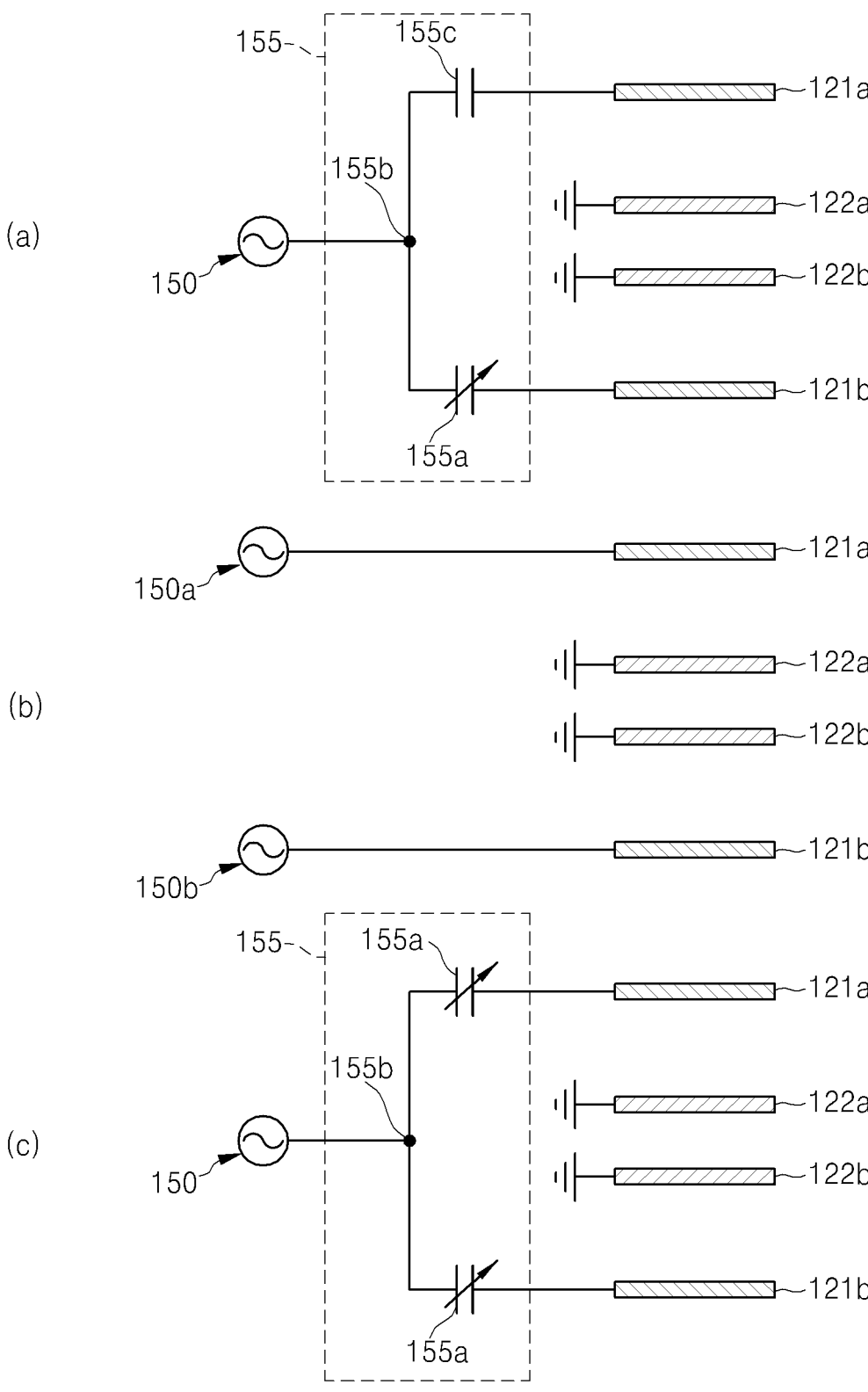
FIG. 5 is a conceptual view for explaining supply of high frequency power in accordance with an exemplary embodiment.

FIG. 5 is a conceptual view for explaining supply of the high frequency power in accordance with an exemplary embodiment. Here, (a) of FIG. 5 illustrates a case in which the high frequency power is supplied to each of the plurality of power supply electrodes by using one variable capacitor and one fixed capacitor, (b) of FIG. 5 illustrates a case in which the high frequency power is supplied to each of the plurality of power supply electrodes through the plurality of high frequency power source parts, and (c) of FIG. 5 illustrates a case in which the high frequency power is supplied to each of the plurality of power supply electrodes by using a plurality of variable capacitors.

Referring to FIG. 5, as illustrated in (b) of FIG. 5, the high frequency power may be applied to the plurality of power supply electrodes 121*a* and 121*b* through the plurality of high frequency power source parts 150*a* and 150*b*, respectively, but different power may be applied to the plurality of power supply electrodes 121*a* and 121*b* due to a difference in performance between the plurality of high frequency power supply parts 150*a* and 150*b*, respectively. As a result, nonuniform plasmas having different plasma densities may be generated in each of the spaces between the power supply electrodes 121 and the ground electrodes 122. In addition, when the high frequency power is applied to each of the plurality of power supply electrodes 121*a* and 121*b* through the plurality of high frequency power source parts 150*a* and 150*b* to discharge plasma, all the high frequency power may be concentrated into a side, at which the plasma is generated, due to low impedance, and thus, the plasma may not be uniformly generated in the spaces between the power supply electrodes 121 and the ground electrodes 122. In addition, electrical damage may easily occur in the power supply electrode 121 and the ground electrode 122, which generate plasma.

However, when the high frequency power supplied from one high frequency power source part 150 is distributed through the power distribution part 155 and provided to each of the plurality of power supply electrodes 121*a* and 121*b*, the same power may be applied to the plurality of power supply electrodes 121, and thus, the uniform plasma may be generated in the spaces between the power supply electrodes 121 and the ground electrodes 122.

The formation of plasma between each of the spaces between the power supply electrodes 121 and the ground electrodes 122 may be nonuniform due to various (external) factors, and thus, the plasma densities generated in each of the spaces between the power supply electrodes 121 and the ground electrodes 122 may be nonuniform, each other. Particularly, when at least a portion of the power supply electrode 121 is disposed outside the partition wall 115, the partition wall 115 may be disposed in the space between the power supply electrode 121 and the ground electrode 122. Thus, the non-uniformity of the plasma densities in each of the spaces between the power supply electrodes 121 and the ground electrodes 122 may be further intensified. In this case, an intensity or ratio of the high frequency power provided to each of the plurality of power supply electrodes 121*a* and 121*b* may be adjusted through the power distribution part 155, and then, the high frequency power, which is adjusted in intensity or ratio, may be provided to each of the plurality of power supply electrodes 121*a* and 121*b*. As a result, the uniform plasma may be generated in each of the spaces between the power supply electrodes 121 and the ground electrodes 122.

In addition, when the plasma densities, which are respectively generated in the spaces between the power supply electrodes 121 and the ground electrodes 122, are not nonuniform, the high frequency power output from one high frequency power source part 150 may be equally distributed to be supplied to the plurality of the power supply electrodes 121*a* and 121*b*. Here, the high frequency power source part 150 may supply RF power, which is in the form of a pulse, to the plurality of power supply electrodes 121 and also may supply the RF power by adjusting a width and duty ratio of the pulse.

Here, the power distribution part 155 may include a variable capacitor 155*a* provided between a distribution point 155*b*, at which the high frequency power is distributed to each of the plurality of power supply electrodes 121*a* and 121*b*, and at least one 121*a* or 121*b* of the plurality of power supply electrodes 121. The variable capacitor 155*a* may be provided between the distribution point 155*b*, at which the high frequency power is distributed to each of the plurality of power supply electrodes 121*a* and 121*b*, and at least one 121*a* or 121*b* of the plurality of power supply electrodes 121. In addition, the variable capacitor 155*a* may change capacitance (or storage capacity) to adjust the size or ratio of the high frequency power supplied from the high frequency power supply part 150.

For example, one variable capacitor 155*a* may be provided in the power distribution part 155 as illustrated in (a) of FIG. 5. That is, the fixed capacitor 155*c* may be provided between the distribution point 155*b* and one of the power supply electrodes 121*a* or 121*b* of the plurality of power supply electrodes 121, and the variable capacitor 155*a* may be provided between the distribution point 155*b* and the other one 121*b* or 121*a* of the plurality of power supply electrodes 121. As a result, the variable capacitor 155*a* may be adjusted in accordance with the plasma density generated in the space between the one power supply electrode 121*a* or 121*b* and the one ground electrode 122*a* or 122*b* to adjust the plasma density generated in the space between the other power supply electrode 121*b* or 121*a* and the ground electrode 122*b* or 122*a*. Here, the plasma density generated in the space between the other power supply electrode 121*b* or 121*a* and the ground electrode 122*b* or 122*a* may be adjusted to be same as that generated in the space between the one power supply electrode 121*a* or 121*b* and the ground electrode 122*a* or 122*b*.

The plurality of variable capacitors 155*a* may be configured as illustrated in (c) of FIG. 5 and may be disposed to correspond to the plurality of power supply electrodes 121*a* and 121*b*, respectively. The plurality of variable capacitors 155*a* may be connected (or provided) between the distribution point 155*b*, at which the high frequency power supplied from the high frequency power source part 150 is distributed, and the plurality of power supply electrodes 121, respectively. Here, the plurality of variable capacitors 155*a* may adjust the size or ratio of the high frequency power supplied from the electrically connected high frequency power source part 150.

In this embodiment, the variable capacitor 155*a* may be installed at a rear end (or behind) the distribution point 155*b* to be provided between the distribution point 155*b* and at least one 121*a* or 121*b* of the plurality of power supply electrodes 121, thereby adjusting the plasma densities in each of the spaces between the power supply electrodes 121 and the ground electrodes 122.

The batch type substrate processing apparatus 100 in accordance with an exemplary embodiment may further include a control part 160 for selectively adjusting the high frequency power applied to each of the plurality of power supply electrodes 121*a* and 121*b* in accordance with the plasma state.

The control part 160 may selectively adjust the high frequency power applied to each of the plurality of power supply electrodes 121*a* and 121*b* in accordance with the plasma state such as discharge current, a discharge voltage, and a phase. Here, the control part 160 may be connected to the power distribution part 155 to control the variable capacitor 155*a*, thereby adjusting the intensity or ratio of the high frequency power applied to each of the plurality of power supply electrodes 121*a* and 121*b*.

For example, the batch type substrate processing apparatus 100 in accordance with an exemplary embodiment may further includes a plasma measuring part (not shown) that measures the plasma density of each of the spaces between the power supply electrodes 121 and the ground electrodes 122. The control part 160 may adjust the high frequency power applied to each of the plurality of power supply electrodes 121*a* and 121*b* in accordance with the plasma density measured in the plasma measuring part (not shown).

The plasma measuring part (not shown) may measure the plasma density of each of the spaces between the power supply electrodes 121 and the ground electrodes 122 and also may measure the plasma density by measuring discharge characteristic values such as the discharge current, the discharge voltage, and the phase. For example, the plasma measuring part (not shown) may include a probe rod, and the probe rod may be provided in each of the spaces between the power supply electrodes 121 and the ground electrodes 122 to measure the discharge characteristic value of the plasma generated in each of the spaces between the power supply electrodes 121 and the ground electrodes 122. As a result, the plasma measuring part (not shown) may measure the plasma density.

The control part 160 may receive information of the plasma density measured by the plasma measuring part (not shown) to adjust the high frequency power applied to each of the plurality of power supply electrodes 121*a* and 121*b* in accordance with the measured plasma density. Here, the control part 160 may be connected to the power distribution part 155 to control the variable capacitor 155*a*, thereby adjusting the intensity or ratio of the high frequency power applied to each of the plurality of power supply electrodes 121*a* and 121*b*. For example, the probe rod may be provided in each of the spaces between the power supply electrodes 121 and the ground electrodes 122 to adjust the size or ratio of the high frequency power through the variable capacitor 155*a*. Thus, the discharge characteristic value (e.g., the discharge current, the discharge voltage, the phase, etc.) of the plasma generated in each of the spaces between the power supply electrodes 121 and the ground electrodes 122 and/or the plasma density may be measured from the probe rod to adjust the size or ratio of the high frequency power applied to each of the plurality of power supply electrodes 121*a* and 121*b*.

In this embodiment, the size or ratio of the high frequency power applied to each of the plurality of power supply electrodes 121*a* and 121*b* may be controlled so that deposition of the radicals required for the substrate processing process is uniformly and variably adjusted to solve the limitation in which the plasma density distribution is non-uniform.

The batch type substrate processing apparatus 100 in accordance with an exemplary embodiment may further include a plurality of gas supply tubes 170 that supply the process gas, which is decomposed by the plasma, through the discharge hole 171 toward each of the spaces between the power supply electrodes 121 and the ground electrodes 122.

The plurality of gas supply tubes 170 may supply the process gas toward each of the spaces between the power supply electrodes 121 and the ground electrodes 122 through the discharge hole 171. Here, the plurality of gas supply tubes 170 may supply the process gas to each of the spaces between the power supply electrodes 121 and the ground electrodes 122, and the supplied process gas may be decomposed by the plasma in each of the spaces between the power supply electrodes 121 and the ground electrodes 122. Also, the plurality of gas supply tubes 170 may include the discharge hole 171, and the discharge hole 171 may be provided in the form of a slit extending in the longitudinal direction of the reaction tube 110 and be provided in plurality to be arranged in the longitudinal direction of the reaction tube 110. The discharge hole 171 may supply (or discharge) the process gas supplied through the passage of the gas supply tube 170 to the discharge space 125. Here, the discharge hole 171 may be defined toward the space between the power supply electrode 121 and the ground electrode 122 and may supply the process gas into the space between the power supply electrode 121 and the ground electrode 122.

For example, the plurality of gas supply tubes 170 may be provided outside a discharge space 125 to extend in the longitudinal direction of the reaction tube 110 and then be disposed outside (in a line) in a width direction of the reaction tube 110 from a line connected along the arrangement of the power supply electrode 121 and a ground electrode 122. Here, the discharge hole 171 of the gas supply tubes 170 may be respectively provided to face each of the spaces between the power supply electrodes 121 and the ground electrodes 122. The gas supply tube 170 may supply the process gas to the discharge space 125 so that the process gas required for the process in which the substrate 10 is processed is decomposed in the plasma forming part 120. Here, when the discharge space 125 is filled with the process gas supplied from the plurality of gas supply tubes 170, predetermined high frequency power may be applied to each of the plurality of power supply electrodes 121*a* and 121*b* to form a pair (or face each other), thereby generating plasma between the power supply electrode 121 and the ground electrode 122. In addition, the process gas excited and decomposed into the plasma state may be provided to the inside of the processing space 111 so that the substrate processing process is performed.

The plurality of gas supply tubes 170 may be provided outside in the width direction of the reaction tube 110 from the line connected along the arrangement of the power supply electrode 121 and the ground electrode 122, and when the discharge hole 171 of the gas supply tubes 170 is respectively provided to face each of the spaces between the power supply electrodes 121 and the ground electrodes 122, the discharge hole 171 of the gas supply tube 170 may face the space between the power supply electrode 121 and the ground electrode 122 to directly supply (or transfer) the process gas into the space between the power supply electrode 121 and the ground electrode 122. Thus, a plasma decomposition rate for the process gas may increase. That is, the process gas supplied through the discharge hole 171 of the gas supply tube 170 may be directly supplied to the space between the power supply electrode 121 and the ground electrode 122, in which the plasma is generated (or formed) (that is, the plasma is generated), and thus a time taken to diffuse the process gas to be decomposed into the plasma generating space may be shortened. Thus, the decomposition rate of the process gas may be improved to improve the plasma decomposition rate.

In addition, the plurality of gas supply tubes 170 may be provided outside in the width direction of the reaction tube 110 from the line connected along the arrangement of the power supply electrode 121 and the ground electrode 122, and the discharge hole 171 of the gas supply tubes 170 may be respectively provided to face each of the spaces between the power supply electrodes 121 and the ground electrodes 122, thereby reducing a volume of the discharge space 125 surrounded by the partition wall 115. Thus, a time taken to uniformly diffuse the process gas supplied into the discharge space 125 may be reduced, and the process gas may be plasma-decomposed to reduce a time taken to supply the process gas to the processing space 111. In FIG. 1, the plurality of gas supply tubes 170 protrude from an outer surface of the reaction tube 110 and are respectively provided between the power supply electrodes 121 and the ground electrode 122. However, the positions of the plurality of gas supply tubes 170 are not specifically limited as long as the plurality of gas supply tubes 170 are provided between the power supply electrodes 121 and the ground electrode 122, and simultaneously, are provided outside from the extension line of the power supply electrode 121 and the ground electrode 122.

The process gas may include one or more gases and may include a source gas and/or a reactive gas reacting with the source gas, and the source gas and the reactive gas may react to form a thin film. Here, the process gas decomposed by the plasma may be a reaction gas, and the source gas may be directly supplied to the processing space 111 through a separate source gas supply tube 175. Unlike the source gas supply tube 175 that directly supplies the source gas to the processing space 111, the gas supply tube 170 first supplies the reaction gas (or the process gas) to the discharge space 125 in the plasma forming part 120. Here, the reaction gas may be activated by the plasma and then be provided to the processing space 111. For example, when a thin film material to be deposited on the substrate 10 is silicon nitride, the source gas may include a gas including (or containing) silicon (e.g., dichlorosilane ($SiH_2Cl_2$, DCS), etc.), and the reaction gas may include a gas containing nitrogen (e.g., $NH_3$, $N_2O$, NO, etc).

In this embodiment, the reaction gas, such as $NH_3$, $N_2O$, NO, etc., which has a relatively higher gas decomposition temperature than that of the source gas decomposed even at a low temperature, may be supplied to the plasma forming part 120, and thus, the reaction gas may be effectively decomposed by the plasma forming part 120 and be provided to the processing space.

The batch type substrate processing apparatus 100 in accordance with an exemplary embodiment may further include a heating means (not shown) surrounding the reaction tube 110 to heat the plurality of substrates 10. Also, the substrate boat 50 may rotate by a rotating means (not shown) to be connected to a lower portion of the substrate boat 50 so as to realize uniformity of the substrate processing process.

In addition, the plasma forming part 120 may be include a plurality of injection holes 123, which are provided to be dislocated with respect to a discharge direction of the discharge hole 171, and are arranged in the longitudinal direction of the reaction tube 110 to supply the radicals of the process gas decomposed by the plasma to the processing space 111. The plurality of injection holes 123 may be arranged in the longitudinal direction of the reaction tube 110, may supply the radicals from the process gas decomposed by the plasma to the processing space 111, and may be provided to be dislocated with respect to the discharge direction of the discharge holes 171. Here, the plurality of injection holes 123 may be provided in a plurality of rows arranged in the longitudinal direction of the reaction tube 110, and each of the rows may be provided to be spaced apart from each other in the circumferential direction of the reaction tube 110.

That is, the injection hole 123 and the discharge hole 171 may be provided to be dislocated with respect to each other in a radial direction from a central axis of the reaction tube 110, and the radial direction from the central axis of the reaction tube 110 to the injection hole 123 and the radial direction from the central axis of the reaction tube 110 to the discharge port 171 may be dislocated with respect to each other. For example, the plurality of injection holes 123 may be respectively defined at different heights in the longitudinal direction of the reaction tube 110 to correspond to the unit processing space of the substrate boat 50 and simultaneously be disposed at a position corresponding to at least one of the plurality of electrodes 121 and 122 extending in the longitudinal direction of the reaction tube 110. In this case, since the discharge hole 171 of the gas supply tubes 170 is respectively provided to face each of the spaces between the power supply electrodes 121 and the ground electrodes 122, the plurality of injection holes 123 may be provided to be dislocated with respect to the discharge direction of the discharge holes 171. When the positions of the plurality of injection holes 123 and the discharge holes 171 do not correspond to each other and are dislocated with respect to each other, the process gas supplied to the discharge space 125 through the discharge holes 171 may not be directly discharged to the processing space 111 through the injection hole 123, but be decomposed after a time margin for the plasma decomposition and then be supplied to the processing space 111, thereby more improving plasma decomposition efficiency.

Figure 6:
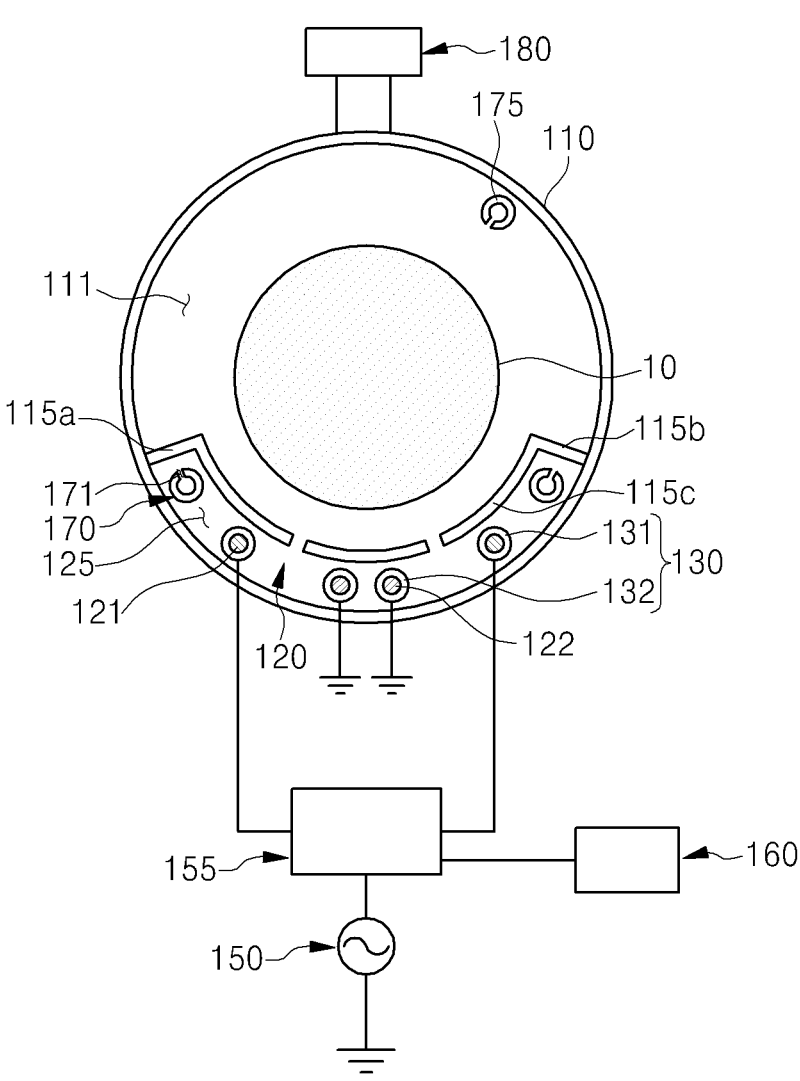
FIG. 6 is a horizontal cross-sectional view illustrating an example of a plurality of gas supply tubes in accordance with an exemplary embodiment.

FIG. 6 is a horizontal cross-sectional view illustrating an example of the plurality of gas supply tubes in accordance with an exemplary embodiment.

Referring to FIG. 6, the batch type substrate processing apparatus 100 in accordance with an exemplary embodiment may further include a plurality of gas supply tubes 170 provided outside each of both sides of the plurality of electrodes 121 and 122 in the circumferential direction of the reaction tube 110 to supply the process gas decomposed by the plasma into the discharge space 125 through the discharge hole 171.

The plurality of gas supply tubes 170 may be disposed along the circumferential direction of the reaction tube 110 like the plurality of electrodes 121 and 122 and also be provided outside each of both sides of the plurality of electrodes 121 and 122, which are disposed to be spaced apart from each other in the circumferential direction of the reaction tube 110 so that the process gas required for the process for processing the substrate 10 is decomposed in the plasma forming part 120, and thus, the process gas decomposed by the plasma may be supplied to the discharge space 125 through the discharge hole 171.

When the discharge space 125 is filled with the process gas by receiving the process gas from the plurality of gas supply tubes 170, predetermined high frequency power may be applied to each of the plurality of power supply electrodes 121a and 121b to plasma-decompose the process gas. The process gas decomposed as described above may be provided to the processing space 111 so that the substrate processing process is performed.

Also, the plurality of gas supply tubes 170 may include the discharge hole 171, and the discharge hole 171 may be provided in the form of a slit extending in the longitudinal direction of the reaction tube 110 and be provided in plurality to be arranged in the longitudinal direction of the reaction tube 110. The discharge hole 171 may supply the process gas supplied through the passage of the gas supply tube 170 to the discharge space 125.

Here, when the gas supply tube 170 is provided in the partition wall 115 (i.e., the discharge space), the discharge hole 171 may be defined to face an opposite direction to the power supply electrode 121. When the discharge hole 171 of the gas supply tube 170 provided outside the power supply electrode 121 is provided to face the partition wall 115, the process gas supplied from the discharge hole 171 may be gradually diffused from the partition wall 115 facing the discharge hole 171 to a central region of the discharge space 125, and thus, the process gas may be uniformly distributed in the entire space of the discharge space 125. Accordingly, the entire process gas may be plasma-decomposed and provided to the processing space 111.

On the other hand, when the discharge hole 171 of the gas supply tube 170 provided outside the power supply electrode 121 is not defined at a position facing the partition wall 115, but is defined at a position facing the power supply electrode 121, the process gas may be diffused into the discharge space 125 and thus do not have the time margin for the plasma decomposition. Thus, the process gas may be discharged into the processing space 111 through the injection hole 123 of the plasma forming part 120. As a result, the process gas may be wasted, and thus, process efficiency may be deteriorated.

However, in this embodiment, since the discharge hole 171 of the gas supply tube 170 may be defined at a position opposite to the partition wall 115, the process gas may not be discharged directly into the processing space 111 through the injection hole 123 of the plasma forming part 120, but be uniformly diffused into the central region from an edge region of the discharge space 125 (i.e., from the partition wall facing the discharge hole) to be filled. Thus, the time margin for the process gas to stay in the discharge space 125 may increase to improve the plasma decomposition efficiency of the process gas.

In addition, when the gas supply tube 170 is disposed outside the partition wall 115 (i.e., the outside of the sub sidewall of the partition wall 115), the process gas may be supplied to the discharge space 125 in the partition wall 115. Here, the discharge hole 171 may face the power supply electrode 121. In this case, since the gas supply tube 170 is disposed outside the sub sidewalls 115a and 115b of the partition wall 115 to directly supply the process gas to the discharge space 125 in the partition wall 115, a uniform pressure may be generated in the discharge space 124 with a short time without generating vortex in the discharge space 125. In addition, since the gas supply tube 170 is disposed outside the partition wall 115, a volume of the discharge space 125 may be small, and thus the uniform pressure may be generated in the discharge space 125 within the short time.

Here, the plurality of gas supply tubes 170 may be symmetrically disposed at both sides of a radial direction C-C' extending from a central axis C of the reaction tube 110 to a center of the discharge space 125. Here, the plurality of electrodes 121 and 122 may also be symmetrically disposed at both sides of the radial direction C-C' extending to the center of the discharge space 125. When the plurality of gas supply tubes 170 are symmetrically disposed in the radial direction CC' extending to the center of the discharge space 125, the process gas may be uniformly supplied to both spaces (or regions) of the discharge space 125, and thus, the process gas may be effectively diffused within the discharge space 125. In addition, since the plurality of electrodes 121 and 122 are symmetrically disposed at both sides of the radial direction CC' extending to the center of the discharge space 125, the plasma uniformity of the both spaces of the discharge space 125 may be improved. Thus, an amount of radicals supplied (or passing through) between the plurality of injection holes 123 defined in the plasma forming part 120 and supplying the radicals to the processing space 111 may be uniform.

The batch type substrate processing apparatus 100 in accordance with an exemplary embodiment may further include an exhaust part 180 communicating with the reaction tube 110 to exhaust process residues in the processing space 111 to the outside.

The exhaust part 180 may communicate with the processing space 111 to discharge the process residues in the processing space 111 to the outside. Here, the exhaust part 180 may be disposed to face the plasma forming part 120.

In addition, the exhaust part 180 may include an exhaust member 181 extending in the longitudinal direction of the reaction tube 110, an exhaust line 182 connected to the exhaust member 181, and an exhaust pump (not shown). The exhaust member 181 may include a plurality of exhaust holes 183, which face the plurality of injection holes 123 of the plasma forming part 120 and are arranged in the longitudinal direction (i.e., a vertical direction) of the reaction tube 110 to correspond to a unit processing space(s) of the substrate boat 50. Thus, the process gas decomposed in the plasma forming part 120 and supplied to the plurality of substrates 10 through the plurality of injection holes 123 may pass through the substrate 10 and be suctioned into the plurality of exhaust holes 183.

Thus, since the plurality of injection holes 123 of the plasma forming part 120 and the plurality of exhaust holes 183 of the exhaust part 180 correspond to each other and are disposed in the same line in a second direction (e.g., a direction parallel to a surface of the substrate) crossing a first direction (or the longitudinal direction of the reaction tube) in which the substrates 10 are laminated, the radical(s) injected from the injection hole (123) may be introduced into the exhaust hole 183 to generate a laminar flow. That is, the radical(s) injected from the injection hole 123 may flow in the direction parallel to the surface of the substrate 10, and thus, the radical(s) may be uniformly supplied to a top surface of the substrate 10. Thus, the radical(s) injected from the injection hole 123 may be in contact with the surface of the substrate 10 and then move along the substrate 10 so as to be introduced into the exhaust hole 183.

As described above, in this embodiment, the process gas may be decomposed by the plasma in the discharge space, which is separated from the processing space, and then be supplied into the processing space to prevent the particles from the thin film deposited on the inner wall of the reaction tube, thereby improving the efficiency of the processing process for the substrate. In addition, the plurality of ground electrodes may be provided between the plurality of power supply electrodes spaced apart from each other to provide the ground electrode corresponding to each of the plurality of power supply electrodes so as to commonly use the ground electrode, thereby preventing the double electric fields from being induced into the ground electrode. Therefore, the plasma damage generated due to the plasma potential, which increases in proportion to the electric fields, may be suppressed or prevented, and thus, the lifespan of the plasma forming part may extend. The sputtering effect may be reduced by using the plurality of power supply electrodes to lower the applied voltage, and the process time may be shortened by using the high plasma density and radicals. In addition, the process gas may be supplied to each of the spaces between the power supply electrodes and the ground electrodes through the plurality of gas supply tubes to improve the plasma decomposition rate. In addition, since the plurality of injection holes of the plasma forming part are provided to be dislocated with respect to the discharge direction of the discharge hole defined in each of the plurality of gas supply tubes, the process gas that is not plasma-decomposed may not be introduced into the process space, but the process gas may be sufficiently decomposed, and then, the radicals may be supplied into the processing space. The high frequency power supplied from one high frequency power supply part may be distributed through the power distribution part and then be provided to the plurality of power supply electrodes so that the uniform plasma is generated in the spaces between the power supply electrodes and the ground electrodes.

Although embodiments have been described with reference to a number of illustrative embodiments thereof, the embodiments are not limited to the foregoing embodiments, and thus, it should be understood that numerous other modifications and embodiments can be devised by those skilled in the art that will fall within the spirit and scope of the principles of this disclosure. Hence, the real protective scope of the present inventive concept shall be determined by the technical scope of the accompanying claims.

In the batch type substrate processing apparatus in accordance with the embodiment, the process gas may be decomposed by the plasma in the discharge space, which is separated from the processing space, and then be supplied into the processing space to prevent the particles from the thin film deposited on the inner wall of the reaction tube, thereby improving the efficiency of the processing process for the substrate.

In addition, the plurality of ground electrodes may be provided between the plurality of power supply electrodes spaced apart from each other to provide the ground electrode corresponding to each of the plurality of power supply electrodes so as to commonly use the ground electrode, thereby preventing the double electric fields from being induced into the ground electrode. Therefore, the plasma damage generated due to the plasma potential, which increases in proportion to the electric fields, may be suppressed or prevented, and thus, the lifespan of the plasma forming part may extend. The sputtering effect may be reduced by using the plurality of power supply electrodes to lower the applied voltage, and the process time may be shortened by using the high plasma density and radicals.

In addition, the process gas may be supplied to each of the spaces between the power supply electrodes and the ground electrodes through the plurality of gas supply tubes to improve the plasma decomposition rate. In addition, since the plurality of injection holes of the plasma forming part are provided to be dislocated with respect to the discharge direction of the discharge hole defined in each of the plurality of gas supply tubes, the process gas that is not plasma-decomposed may not be introduced into the process space, but the process gas may be sufficiently decomposed, and then, the radicals may be supplied into the processing space.

The high frequency power supplied from one high frequency power supply part may be distributed through the power distribution part and then be provided to the plurality of power supply electrodes so that the uniform plasma is generated in the spaces between the power supply electrodes and the ground electrodes.

Although the batch type substrate processing apparatus has(have) been described with reference to the specific embodiments, it is not limited thereto. Therefore, it will be readily understood by those skilled in the art that various modifications and changes can be made thereto without departing from the spirit and scope of the present inventive concept defined by the appended claims.

What is claimed is:

1. A batch type substrate processing apparatus comprising:

a reaction tube configured to provide a processing space in which a plurality of substrates are accommodated; and a plasma forming part having a discharge space, which is distinguished from the processing space by a partition wall extending in a longitudinal direction of the reaction tube, and configured to generate plasma in the discharge space by a plurality of electrodes, wherein the plurality of electrodes are disposed in a circumferential direction of the reaction tube with a rod shape extending in the longitudinal direction of the reaction tube, wherein the plurality of electrodes comprise:

first and second power supply electrodes spaced apart from each other; and first and second ground electrodes provided between the first and second power supply electrodes in the discharge space to be spaced apart from the first and second power supply electrodes, wherein no electrodes are present between the first and second ground electrodes, wherein the plurality of electrodes are configured to generate capacitively coupled plasma (CCP) in each space between the first power supply electrode and the first ground electrode and between the second power supply electrode and the second ground electrode, wherein the first power supply electrode is closer to the first ground electrode than the second ground electrode such that a voltage can be induced to the first ground electrode by the voltage applied to the first power supply electrode, and wherein the second power supply electrode is closer to the second ground electrode than the first ground electrode such that a voltage can be induced to the second ground electrode by the voltage applied to the second power supply electrode.

2. The batch type substrate processing apparatus of claim 1, wherein the first and second ground electrodes are spaced apart from each other.

3. The batch type substrate processing apparatus of claim 2, wherein a spaced distance between the first and second ground electrodes is less than or equal to a spaced distance between the first power supply electrode and the first ground electrode, which are paired with each other.

4. The batch type substrate processing apparatus of claim 1, further comprising an electrode protection part configured to protect the first and second power supply electrodes and the first and second ground electrodes, wherein the electrode protection part comprises:

a plurality of first electrode protection tubes configured to surround the first and second power supply electrodes, respectively;

a plurality of second electrode protection tubes configured to surround the first and second ground electrodes, respectively; and a bridge part configured to connect the first electrode protection tube and the second electrode protection tube, which face each other, to each other.

5. The batch type substrate processing apparatus of claim 4, wherein the bridge part is configured to allow the first electrode protection tube and the second electrode protection tube to communicate with each other, and wherein the batch type substrate processing apparatus further comprises:

a protection gas supply part connected to one electrode protection tube of the first electrode protection tube and the second electrode protection tube, which communicate with each other by the bridge part, to supply a protection gas; and a protection gas discharge part connected to the other electrode protection tube of the first electrode protection tube and the second electrode protection tube to discharge the protection gas supplied into the one electrode protection tube.

6. The batch type substrate processing apparatus of claim 5, wherein the protection gas comprises an inert gas.

7. The batch type substrate processing apparatus of claim 1, further comprising:

a high frequency power source part configured to supply high frequency power; and a power distribution part provided between the high frequency power source part and the first and second power supply electrodes and configured to distribute the high frequency power supplied from the high frequency power source part so as to provide the distributed high frequency power to the first power supply electrode and the second power supply electrode.

8. The batch type substrate processing apparatus of claim 7, wherein the power distribution part comprises a variable capacitor provided between a distribution point, at which the high frequency power is distributed to the first power supply electrode and the second power supply electrode, and at least one of the first and second power supply electrodes.

9. The batch type substrate processing apparatus of claim 1, further comprising a control part configured to selectively adjust high frequency power applied to the first power supply electrode and the second power supply electrode in accordance with a state of the plasma.

10. The batch type substrate processing apparatus of claim 1, further comprising a plurality of gas supply tubes, which are provided outside both sides of the plurality of electrodes along a circumferential direction of the reaction tube to supply process gas decomposed by the plasma into the discharge space through a discharge hole.

11. The batch type substrate processing apparatus of claim 10, wherein the plurality of gas supply tubes are symmetrically disposed at both sides of a radial direction extending from a central axis of the reaction tube to a center of the discharge space.

* * * * *